United States Patent
Wu et al.

(10) Patent No.: US 11,955,312 B2
(45) Date of Patent: Apr. 9, 2024

(54) PHYSICAL ANALYSIS METHOD, SAMPLE FOR PHYSICAL ANALYSIS AND PREPARING METHOD THEREOF

(71) Applicant: Materials Analysis Technology Inc., Hsinchu County (TW)

(72) Inventors: Chien-Wei Wu, Hsinchu County (TW); Keng-Chieh Chu, New Taipei (TW); Yung-Sheng Fang, Hsinchu (TW); Chun-Wei Wu, New Taipei (TW); Hung-Jen Chen, Hsinchu (TW)

(73) Assignee: MATERIALS ANALYSIS TECHNOLOGY INC., Hsinchu County (TW)

( * ) Notice: Subject to any disclaimer, the term of this patent is extended or adjusted under 35 U.S.C. 154(b) by 356 days.

(21) Appl. No.: 17/560,460

(22) Filed: Dec. 23, 2021

(65) Prior Publication Data
US 2022/0223373 A1    Jul. 14, 2022

(30) Foreign Application Priority Data
Jan. 8, 2021  (TW) ............................... 110100711

(51) Int. Cl.
*H01J 37/317* (2006.01)
*H01J 37/20* (2006.01)

(52) U.S. Cl.
CPC .......... *H01J 37/3178* (2013.01); *H01J 37/20* (2013.01)

(58) Field of Classification Search
CPC ........ H01J 37/3178; H01J 37/20; G01N 1/28; G01N 23/00; G01N 1/36; G01N 23/04;
(Continued)

(56) References Cited

U.S. PATENT DOCUMENTS

| 7,786,436 B1 * | 8/2010 | Lundquist | ............ G01R 31/307 324/762.02 |
| 8,705,027 B2 * | 4/2014 | Lange | ............... G01N 21/95607 356/237.4 |

(Continued)

FOREIGN PATENT DOCUMENTS

| CN | 102374942 A | 3/2012 |
| CN | 103868766 A | 6/2014 |

(Continued)

OTHER PUBLICATIONS

Yi Qiang Shen, Li Hong Li, Irene Tee, Kok Wah Lee, Ye Chen, Jie Zhu & Si Ping Zhao; "A study of coating techniques for ultra-thin film X-TEM sample preparation"; 2017 IEEE 24th International Symposium on the Physical and Failure Analysis of Integrated Circuits (IPFA), IEEE, Jul. 4, 2017(Jul. 4, 2017), pp. 1-4.

(Continued)

*Primary Examiner* — David A Vanore
(74) *Attorney, Agent, or Firm* — Li & Cai Intellectual Property (USA) Office

(57) ABSTRACT

A physical analysis method, a sample for physical analysis and a preparing method thereof are provided. The preparing method of the sample for physical analysis includes: providing a sample to be inspected; and forming a contrast enhancement layer on a surface of the sample to be inspected. The contrast enhancement layer includes a plurality of first material layers and a plurality of second material layers stacked upon one another. The first material layer and the second material layer are made of different materials. Each one of the first and second material layers has a thickness that does not exceed 0.1 nm. In an image captured by an electron microscope, a difference between an average grayscale value of a surface layer image of the (Continued)

sample to be inspected and an average grayscale value of an image of the contrast enhancement layer is at least 50.

28 Claims, 9 Drawing Sheets

(58) Field of Classification Search
CPC ........... G01N 23/2202; G01N 23/2251; G01N 2223/03; G01N 2223/404; G01N 2223/418
See application file for complete search history.

(56) References Cited

U.S. PATENT DOCUMENTS

| | | | | |
|---|---|---|---|---|
| 10,539,612 | B2* | 1/2020 | Duffy | G01R 31/305 |
| 11,448,603 | B1* | 9/2022 | Norman | G01N 21/9505 |
| 2004/0218806 | A1* | 11/2004 | Miyamoto | G06F 18/40 |
| | | | | 382/145 |
| 2012/0113416 | A1* | 5/2012 | Lange | G01N 21/95607 |
| | | | | 428/161 |
| 2016/0341791 | A1* | 11/2016 | Duffy | G01R 31/305 |
| 2017/0069457 | A1* | 3/2017 | English | H01J 37/20 |
| 2020/0240984 | A1* | 7/2020 | Lim | G01N 33/54306 |
| 2020/0271591 | A1* | 8/2020 | Havener | G01N 21/94 |
| 2022/0223373 | A1* | 7/2022 | Wu | H01J 37/20 |

FOREIGN PATENT DOCUMENTS

| | | |
|---|---|---|
| CN | 105865869 A | 8/2016 |
| EP | 3922752 A1 | 12/2021 |
| JP | 2002506992 A | 3/2002 |
| JP | 201344547 A | 3/2013 |
| JP | 2014130145 A | 7/2014 |
| JP | 2018510968 A | 4/2018 |
| JP | 2018518598 A | 7/2018 |
| JP | 2018524464 A | 8/2018 |
| JP | 2018194539 A | 12/2018 |
| TW | 200507734 A | 2/2005 |
| TW | 200944778 A1 | 11/2009 |
| TW | 201806750 A | 3/2018 |
| TW | I692633 B | 5/2020 |

OTHER PUBLICATIONS

Kang-Ping Peng, Ya-Chi Liu, I-Feng Lin, Chir-Chien Lin, Sho-Wethuang, and Chao-Cheng Ting; "The development of low-temperature atomic layer deposition of HfO 2 for TEM sample preparation on soft photo-resist substrate"; Jul. 19, 2018(Jul. 19, 2018); URL: http://ieeexplore.ieee.org/stampPDF/getPDF.jsp?tp=&arnumber=8452177&ref=aHR0cHM6Ly9pZWVleHBsb3JlLmllZWUub3JnL2RvY3VtZW50Lzg0NTIxNzc=2018 IEEE International Symposium (IPFA), Jul. 16-19, 2018.

Anil U. Mane, Jefferey W. Elam; "Nanocomposite Coatings with Tunable Properties Prepared by Atomic Layer Deposition"; Argonne National Laboratory, Argonne, Illinois 60439, USA; Material Matters, Dec. 31, 2018 (Dec. 31, 2018); URL: http://www.sigmaaldrich.com/NL/en/technical-documents/technical-article/materials-science-and-engineering/chemical-vapor-deposition/nanocomposite-coatings-with-tunable-properties.

Sharmila M. Mukhopadhyay; "Sample Preparation for Microscopic and Spectroscopic Characterization of Solid Surfaces and Films" In: "Sample Preparation Techniques in Analytical Chemistry"; Sep. 19, 2003(Sep. 19, 2003); John Wiley & Sons, Inc., Hoboken, NJ, USA; vol. 162; pp. 377-411.

* cited by examiner

PHYSICAL ANALYSIS METHOD, SAMPLE FOR PHYSICAL ANALYSIS AND PREPARING METHOD THEREOF

CROSS-REFERENCE TO RELATED PATENT APPLICATION

This application claims the benefit of priority to Taiwan Patent Application No. 110100711, filed on Jan. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a physical analysis method, a sample for physical analysis and a preparing method thereof, and more particularly to a physical analysis method that uses an electron microscope, a sample for physical analysis and a preparing method thereof.

BACKGROUND OF THE DISCLOSURE

In response to electronic devices (such as an integrated circuit device) being gradually reduced in size, a line pitch and a line width of an integrated circuit are becoming more and more narrow, and the difficulty of a fabrication process is also increased. Accordingly, the fabrication process of the electronic device has to be continuously modified, so as to keep a fabrication yield of the electronic device at a required level.

During the fabrication process of the electronic device, defects may be formed and cause lowering of the fabrication yield. In order to find out why the defects are formed and thereby improve the fabrication process, instruments are usually required for performing inspection, detection, and physical analysis. Recently, the instrument that is most commonly used for physical analysis is an electron microscope, such as a transmission electron microscope (TEM), a scanning electron microscope (SEM), and a focused ion beam electron microscope (FIB-EM).

The transmission electron microscope (TEM), for example, is to form an image by transmitting a beam of electrons through a sample. Accordingly, the sample is usually thinned to 50 nm to 100 nm so as to be suitable for the inspection of the transmission electron microscope (TEM). However, a detailed structure of the sample may be damaged during the thinning process, which can result in distortion of inspection results. As such, the real reasons behind the drop in the fabrication yield cannot be easily determined. Accordingly, before the sample is thinned, at least one protective layer is formed on a surface of the sample, so as to prevent the sample from being damaged during the thinning process.

However, there are many types of samples, and one of the samples may include many different materials. Therefore, when an image of the sample is captured by the transmission electron microscope, since the material of a surface layer of the sample can be the same as that of the protective layer or grayscales of the sample and the protective layer in the image can be too close, a boundary between the protective layer and the sample cannot be easily recognized, thereby increasing the difficulty of image capturing. In addition, in the image captured by the transmission electron microscope, a surface profile of the sample can be difficult to recognize due to a low acutance.

The acutance of the image may be improved by a subsequent image processing. However, if a difference between the grayscales of the sample and the protective layer in the image is too small, any improvement in the acutance is limited. As such, more time is needed for processing the image, which increases time and cost for inspection and analysis. Furthermore, the image may be distorted due to the image processing, such that analyzing the image and finding the defects are not likely to be completed within a short period of time. Accordingly, how to improve a physical analysis method or a preparing method of a sample for physical analysis, so as to overcome the abovementioned shortcomings, is still one of the important issues to be addressed in this industry.

SUMMARY OF THE DISCLOSURE

In response to the above-referenced technical inadequacies, the present disclosure provides a physical analysis method, a sample for physical analysis and preparing method thereof, so as to not only provide protection for a sample to be inspected, but also improve an edge contrast and an edge acutance of the sample to be inspected, thereby reducing the time cost of inspection.

In one aspect, the present disclosure provides a preparing method of a sample for physical analysis, which includes the following steps: providing a sample to be inspected; and forming a contrast enhancement layer on a surface of the sample to be inspected according to a material of the sample to be inspected. The contrast enhancement layer includes m layers of first material layers and n layers of second material layers that are stacked upon one another, m and n each being zero or a positive integer, and satisfying the following relationship: (m+n)>0. A material of each of the first material layers is different from that of each of the second material layers, and each one of the first material layers and the second material layers has a thickness that does not exceed 0.1 nm. In an image captured by an electron microscope, a difference between an average grayscale value of a surface layer image of the sample to be inspected and an average grayscale value of an image of the contrast enhancement layer is at least 50.

In another aspect, the present disclosure provides a sample for physical analysis that includes a sample to be inspected and a contrast enhancement layer. The contrast enhancement layer is formed on a surface of the sample to be inspected, and includes m layers of first material layers and n layers of second material layers that are stacked upon one another, m and n each being zero or a positive integer, and satisfying the following relationship: (m+n)>0. A material of each of the first material layers is different from that of each of the second material layers. Each one of the first and second material layers has a thickness that does not exceed 0.1 nm. In an image captured by an electron microscope, a difference between an average grayscale value of a surface layer image of the sample to be inspected and an average grayscale value of the image of the contrast enhancement layer is at least 50.

In yet another aspect, the present disclosure provides a physical analysis method. In the physical analysis method, a sample for physical analysis is prepared through the step of providing a sample to be inspected and forming a contrast enhancement layer on a surface of the sample to be inspected according to a material of the sample to be inspected. Then, an image of the sample for physical analysis is captured. The image of the sample for physical analysis contains an image of the contrast enhancement layer and an image of the sample to be inspected, and a difference between an average grayscale value of the image of the contrast enhancement layer and an average grayscale value of a surface layer image of the sample to be inspected is at least 50.

Therefore, one of the advantages of the present disclosure is that, in the physical analysis method, the sample for physical analysis and the preparing method thereof, by virtue of "forming the contrast enhancement layer on the surface of the sample to be inspected" and "in the image captured by the electron microscope, the difference between the average grayscale value of the surface layer image of the sample to be inspected and the average grayscale value of the image of the contrast enhancement layer being at least 50," the contrast enhancement layer not only can protect the sample to be inspected, but can also improve the edge contrast and the edge acutance of the image of the sample to be inspected, thereby reducing the inspection time and cost.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
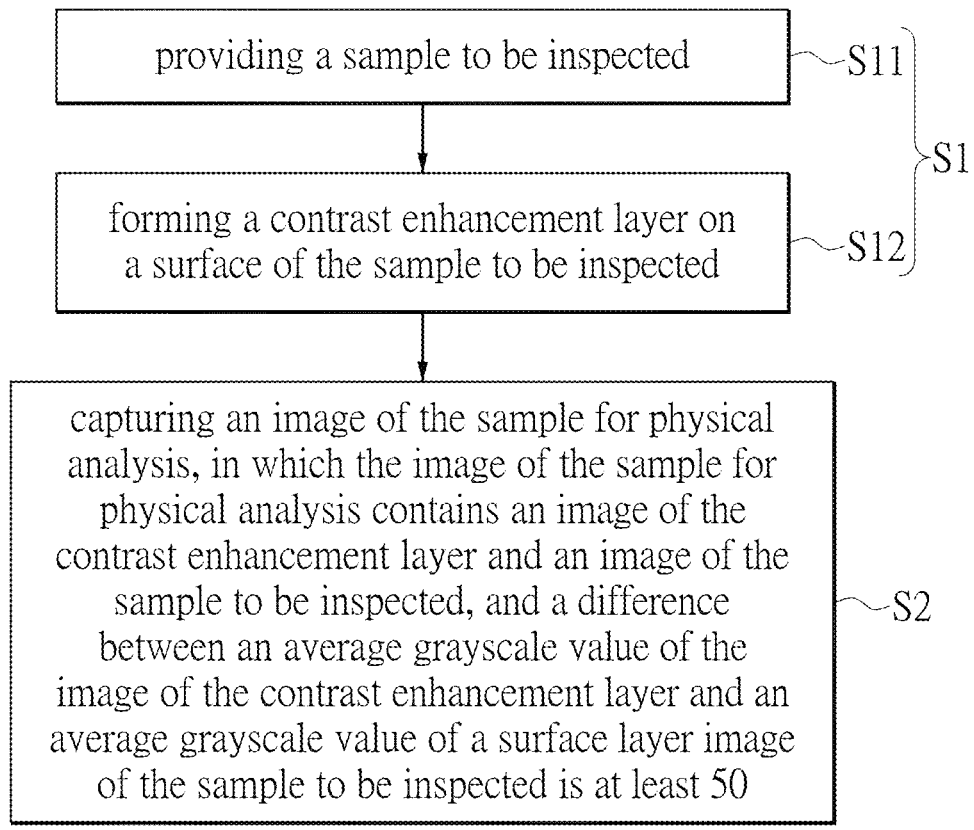
FIG. 1 is a flowchart of a physical analysis method according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1. A physical analysis method is provided in the present disclosure. The aforementioned physical analysis method can be performed by using an electron microscope, such as a transmission electron microscope (TEM), a scanning electron microscope (SEM), or a focused ion beam (FIB) microscope, but the present disclosure is not limited thereto.

In step S1, a sample for physical analysis is prepared. In the embodiment of the present disclosure, the step of preparing the sample for physical analysis at least includes: providing a sample to be inspected in step S11; and forming a contrast enhancement layer on a surface of the sample to be inspected according to a material of the sample to be inspected in step S12. Details of preparing the sample for physical analysis according to one embodiment of the present disclosure will be illustrated below.

The physical analysis method of the embodiment in the present disclosure further includes: capturing an image of the sample for physical analysis in step S2. The image of the sample for physical analysis contains an image of the contrast enhancement layer and an image of the sample to be inspected, and a difference between an average grayscale value of the image of the contrast enhancement layer and an average grayscale value of a surface layer image of the sample to be inspected is at least 50. Specifically, an electron microscope can be used to capture the image of the sample for physical analysis, so as to analyze physical properties of the sample to be inspected.

In the following description, detailed processes of a preparing method of the sample for physical analysis and the physical analysis method in the embodiment of the present disclosure will be further illustrated.

Figure 2:
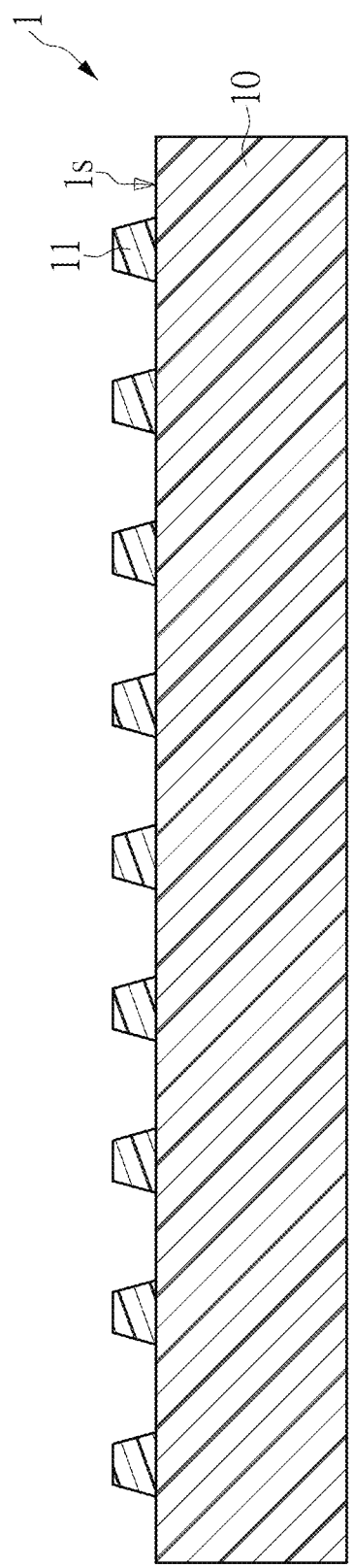
FIG. 2 is a partial sectional view of a sample to be inspected according to one embodiment of the present disclosure.

Reference is made to FIG. 2, which is a schematic sectional view of a sample to be inspected according to one embodiment of the present disclosure. A sample to be inspected 1 can be a semi-finished product or a product of a semiconductor device. For example, the sample to be inspected 1 can be a transistor, a diode, a laser, an LED, a resistor, an inductor, an integrated circuit device that includes any combination thereof, or any semi-finished product of the aforementioned devices during a fabrication process. However, the present disclosure is not limited thereto.

The sample to be inspected 1 of the instant embodiment includes a base 10 and a plurality of microstructures 11 formed on the base 10. Accordingly, a surface 1s of the sample to be inspected 1 is an uneven surface. A width of each of the microstructures 11 or a distance between any two adjacent ones of the microstructures 11 can be microscale or nanoscale. Furthermore, the aforementioned microstructures 11 can be, for example, wires of an integrated circuit device, gates of transistors, three-dimensional structures of a fin field effect transistor, or a microlens array, but the present disclosure is not limited thereto. In some situations, a physical analysis for the sample to be inspected 1 is to analyze whether or not defects exist in the microstructures 11, so as to determine whether a fabrication process of the microstructures 11 needs to be modified.

It should be noted that the sample to be inspected 1 is merely exemplified for describing the physical analysis method and the preparing method of the sample for physical analysis, and is not intended to limit the present disclosure. The structure of the sample to be inspected 1 varies according to the type of the device to be fabricated. That is to say, the sample to be inspected 1 may have a simpler or a more complex structure. For example, the sample to be inspected 1 may include only the base 10 and not the microstructures 11. In another embodiment, the sample to be inspected 1 includes not only the microstructures 11, but also one or more films that cover the base 10 and the microstructures 11. However, the present disclosure is not limited thereto. Furthermore, the microstructures 11 shown in FIG. 2 have been simplified for ease of illustration, but the present disclosure is not limited thereto. Accordingly, each of the microstructures 11 can have shapes different from that shown in FIG. 2.

In one embodiment, a material of the base 10 is different from a material of the microstructures 11. The materials of the base 10 and the microstructures 11 can each be selected from a group consisting of metal, a semiconductor material, glass, ceramic, plastic, and any combination thereof. The semiconductor material can be, for example, silicon, germanium, silicon carbide, gallium arsenide, gallium nitride, indium gallium nitride, aluminum gallium nitride, etc. In another embodiment, the material of the microstructures 11 can be the same as that of the base 10, and the present disclosure is not limited thereto.

Figure 3:
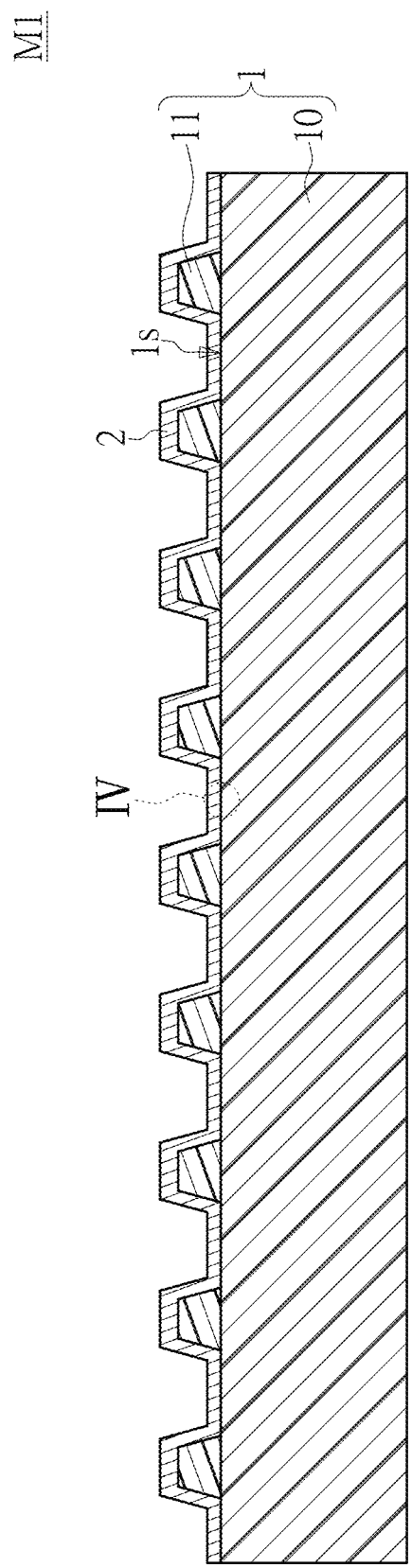
FIG. 3 is a partial sectional view of a sample for physical analysis according to one embodiment of the present disclosure.

Reference is made to step S12 shown in FIG. 1, which is to be read in conjunction with FIG. 3. FIG. 3 is a schematic partial sectional view of a sample for physical analysis according to one embodiment of the present disclosure. A contrast enhancement layer 2 is formed on the surface 1s of the sample to be inspected 1. In the instant embodiment, the contrast enhancement layer 2 conformingly covers the surface 1s of the sample to be inspected 1, so as to protect the sample to be inspected 1. Furthermore, when a sample for physical analysis M1 is inspected, the contrast enhancement layer 2 can be used to increase an edge contrast and an edge acutance of the sample to be inspected 1. In one embodiment, the contrast enhancement layer 2 has a thickness ranging from 2 nm to 30 nm.

It should be noted that in an image of the sample for physical analysis M1 that is captured by an electron microscope (such as TEM), a difference between an average grayscale value of an image of the contrast enhancement layer 2 and an average grayscale value of a surface layer image of the sample to be inspected 1 is at least 50. In addition, the image captured by the electron microscope is usually a grayscale image. In the grayscale image, a grayscale value of each pixel can be indicated by 2n bits, in which n is a positive integer. In the instant embodiment, eight bits (i.e., n=4) can be utilized to indicate the grayscale value of each pixel, and the grayscale value can range from 0 (black) to 255 (white).

Furthermore, the aforementioned average grayscale value of the image of the contrast enhancement layer 2 is a mean of the grayscale values of the pixels in the image of the contrast enhancement layer 2. For example, when the image of the contrast enhancement layer 2 is assumed to include X pixels P1~Px, and the pixels P1~Px respectively have grayscale values G1~Gx, an average grayscale value G can be calculated by the following relationship: G=(G1+G2+G3+•••.+Gx)/X, but the present disclosure is not limited thereto. In another embodiment, the average grayscale value can be obtained by another formula according to particular implementations. The average grayscale value can be, for example, a geometric mean, a harmonic mean, a geometric-harmonic mean, and an arithmetic-geometric mean of the grayscale values of the pixels in the image of the contrast enhancement layer 2.

Similarly, the aforementioned average grayscale value of the surface layer image of the sample to be inspected 1 is a mean of the grayscale values of the pixels in the surface layer image of the sample to be inspected 1. Furthermore, the aforementioned surface layer of the sample to be inspected 1 refers to a region that extends inward from a surface of the sample to be inspected 1 for 2 nm to 20 nm. When the difference between the average grayscale value of the image of the contrast enhancement layer 2 and the average grayscale value of the surface layer image of the sample to be inspected 1 is 50, a distinction between the image of the sample to be inspected 1 and the image of the contrast enhancement layer 2 can be perceived by the naked eye.

To be more specific, in the present disclosure, a material of the contrast enhancement layer 2 is chosen depending on a material of the surface layer of the sample to be inspected 1, so that the image of the sample to be inspected 1 can be obviously distinguished from the image of the contrast enhancement layer 2 in the image of the sample for physical analysis M1. Specifically, the grayscale value of the image of either the sample to be inspected 1 or the contrast enhancement layer 2 is related to atomic numbers of elements contained therein. That is to say, the greater the atomic numbers of the elements contained in either the sample to be inspected 1 or the contrast enhancement layer 2 are, the lower the grayscale values of most pixels in either the surface layer image of the sample to be inspected 1 or in the image of the contrast enhancement layer 2 captured by an electron microscope (such as TEM) are and the darker a color thereof is. Accordingly, if the atomic numbers of the elements contained in the sample to be inspected 1 are greater and a darker colored surface layer image of the sample to be inspected 1 (i.e., including more pixels with low grayscale values) is obtained, the material of the contrast enhancement layer 2 preferably contains the element having a smaller atomic number, so that the obtained image of the contrast enhancement layer 2 is of a lighter color (or including more pixels with high grayscale values).

In one embodiment, the material of the contrast enhancement layer 2 can be an oxide, a carbide, a nitride, or an oxynitride of a metal element or non-metallic element. The metal element is, for example, aluminum, hafnium, titanium, platinum, indium, tin, zirconium, gallium, molybdenum or tantalum, and the non-metallic element is silicon, boron, selenium, tellurium, or arsenic, but the present disclosure is not limited to the examples provided herein. As long as the difference between the average grayscale value of the image of the contrast enhancement layer 2 and the average grayscale value of the surface layer image of the sample to be inspected 1 is 50 (such that an interface between the sample to be inspected 1 and the contrast enhancement layer 2 can be differentiated by the human eye), the material of the contrast enhancement layer 2 is not limited in the present disclosure. However, in the instant embodiment, many different kinds of precursor gases or raw materials may be prepared for forming various contrast enhancement layers 2, so as to cooperate with different samples to be inspected 1 that are respectively made of different materials.

Accordingly, in another embodiment, the contrast enhancement layer 2 can include at least two different materials. One of the materials contains an element having a larger atomic number, and another one of the materials contains an element having a smaller atomic number. By adjusting a ratio between these two materials, the average grayscale value of the image of the contrast enhancement layer 2 can be adjusted.

Figure 4:
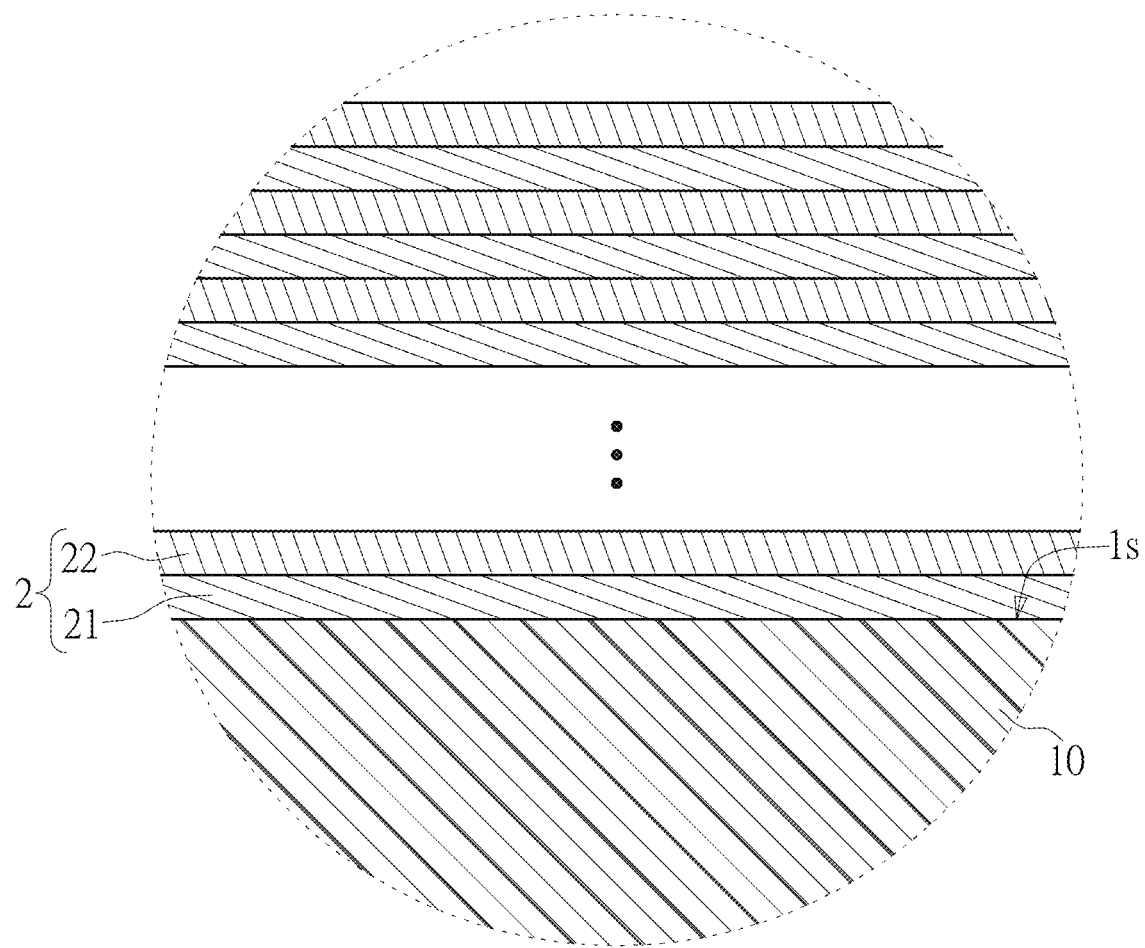
FIG. 4 shows an enlarged view of part IV of FIG. 3.

Reference is made to FIG. 4, which shows an enlarged view of part IV of FIG. 3. In the instant embodiment, the contrast enhancement layer 2 is a composite film, and includes a plurality of first material layers 21 and a plurality of second material layers 22 that are stacked upon one another. A material of each of the first material layers 21 is different from that of each of the second material layers 22. Specifically, one of the first and second material layers 21, 22 contains the element having a larger atomic number, and the other one of the first and second material layers 21, 22 contains the element having a smaller atomic number, but the present disclosure is not limited thereto.

In one embodiment, the material of each of the first material layers is an oxide, a carbide, a nitride, or an oxynitride of a first element, and the material of each of the second material layers is an oxide, a carbide, a nitride, or an oxynitride of a second element. The first and second elements can each be selected from a group consisting of a metal element, a non-metallic element, and a combination thereof. The metal element can be aluminum, hafnium, titanium, platinum, indium, tin, zirconium, gallium, molybdenum or tantalum, and the non-metallic element can be silicon, boron, selenium, tellurium, or arsenic, but the present disclosure is not limited to the examples provided herein.

Each one of the first material layers 21 and the second material layers 22 has a thickness that does not exceed 0.1 nm. Furthermore, each of the first material layers 21 (or the second material layers 22) may include a plurality of monomolecular layers. In one embodiment, each one of the first and second material layers 21, 22 can include one to three monomolecular layers.

It should be noted that in FIG. 4, the first material layers 21 and the second material layers 22 are shown to be stacked upon one another. However, in practice, since each one of the first and second material layers 21, 22 is extremely thin, a boundary or an obvious distinction between two adjacent ones of the first and second material layers 21, 22 can hardly be observed by the conventional electron microscope with a magnification lower than a specific value (such as 800K times) or with a resolution lower than 4K.

It should be noted that in one embodiment, a layer number of the first material layers 21 is in positive correlation to a concentration of the first element, and a layer number of the second material layers 22 is in positive correlation to a concentration of the second element. Since the materials of the first material layer 21 and the second material layer 22 respectively contain elements having different atomic numbers, when the image of the sample for physical analysis M1 is captured by an electron microscope (such as TEM), the average grayscale value of the image of contrast enhancement layer 2 is affected by the layer numbers of the first and second material layers 21, 22.

In other words, in the embodiment of the present disclosure, by alternately forming the first material layers 21 and the second material layers 22, the overall visual grayscale shades of the image of the contrast enhancement layer 2 that is captured during the following physical analysis can be adjusted. As such, by changing a ratio of the layer number of the first material layers 21 to the layer number of the second material layers 22, the images of the contrast enhancement layers 2 with different average grayscale values can be obtained. To be more specific, a concept similar to that of a halftone technique is applied in the instant embodiment. By changing the layer numbers and the stacking sequence of the first and second material layers 21, 22, the overall visual grayscale shades of the captured image of the contrast enhancement layer 2 can be changed.

Accordingly, in the instant embodiment, there is no need to prepare many kinds of precursors or raw materials in order to cooperate with different samples to be inspected 1. The precursors or raw materials for fabricating two or three specific kinds of materials are sufficient enough to fabricate various contrast enhancement layers 2 that are suitable for many samples to be inspected 1 with different materials, so that the edge contrast and the edge acutance of any kind of the sample to be inspected 1 can be improved.

In other words, for two samples to be inspected 1 that are respectively made of different materials, two different contrast enhancement layers 2 that are required to be fabricated can include the same materials but have different ratios of those materials. The first material layer 21 is assumed to be an aluminum oxide layer, and the second material layer 22 is assumed to be a hafnium oxide layer. For example, when the material of the sample to be inspected 1 is silicon oxide, most of the pixels in the surface layer image of the sample to be inspected 1 have higher grayscale values and are of a lighter color. Accordingly, the layer number of the second material layers 22 (the hafnium oxide layer) can be increased, i.e., a proportion of the hafnium element in the contrast enhancement layer 2 is increased. In addition, the second material layers 22 are separately distributed in different positions of the contrast enhancement layer 2 (rather than arranged together in a specific region), so that most of the pixels in the entire image of the contrast enhancement layer 2 have lower grayscale values, thereby decreasing the average grayscale value. As such, the color (or the overall grayscale shade) of the image of the contrast enhancement layer 2 is darker than that (or the overall grayscale shade) of the surface layer image of the sample to be inspected 1, so as to highlight an edge contour of the image of the sample to be inspected 1.

For example, when the material of the sample to be inspected 1 is silicon, most of the pixels in the image of the sample to be inspected 1 have lower grayscale values and are of a darker color. Accordingly, by increasing the layer number of the first material layers 21 (aluminum oxide layer) of the contrast enhancement layer 2 (i.e., increasing a proportion of the aluminum element in the contrast enhancement layer 2), and separately arranging the first material layers 21 in the contrast enhancement layer 2, most of the pixels in the image of the contrast enhancement layer 2 have higher grayscale values, so that the average grayscale value of the image of the contrast enhancement layer 2 can be increased, and the color of the image of the contrast enhancement layer 2 is lighter than that of the surface layer image of the sample to be inspected 1.

It is worth mentioning that in one embodiment, a difference between the atomic number of the first element of the first material layer 21 and the atomic number of the second element of the second material layer 22 is greater than or equal to 20. In one preferable embodiment, the difference between the atomic numbers of the first and second elements is greater than or equal to 40. In another preferable embodiment, the difference between the atomic numbers of the first and second elements is greater than or equal to 70. The greater the difference between the atomic numbers of the first and second elements, the wider an adjustable range of the average grayscale value of the image of the contrast enhancement layer 2.

For example, when the first material layer 21 is an aluminum oxide layer, and the second material layer 22 is a hafnium oxide layer, the difference between the atomic number of the first element (Al) and the atomic number of the second element (Hf) is 59. By adjusting a ratio of the layer number of the first material layers 21 to the layer number of the second material layers 22, the average grayscale value of the image of the contrast enhancement layer 2 can be adjusted within a range from 0 to 150.

However, the contrast enhancement layer 2 of the embodiment in the present disclosure can further include a plurality of third material layers. By adjusting proportions of the first material layers 21, the second material layers 22, and the third material layers, the average grayscale value of the image of the contrast enhancement layer 2 can also be adjusted.

Furthermore, it should be noted that in FIG. 4, one of the first material layers 21 is shown to be connected to the surface of the sample to be inspected 1, one of the second material layers 22 is located between any two closest ones of the first material layers 21, and one of the first material layers 21 is located between any two closest ones of the second material layers 22. However, the present disclosure is not limited thereto.

Figure 5:
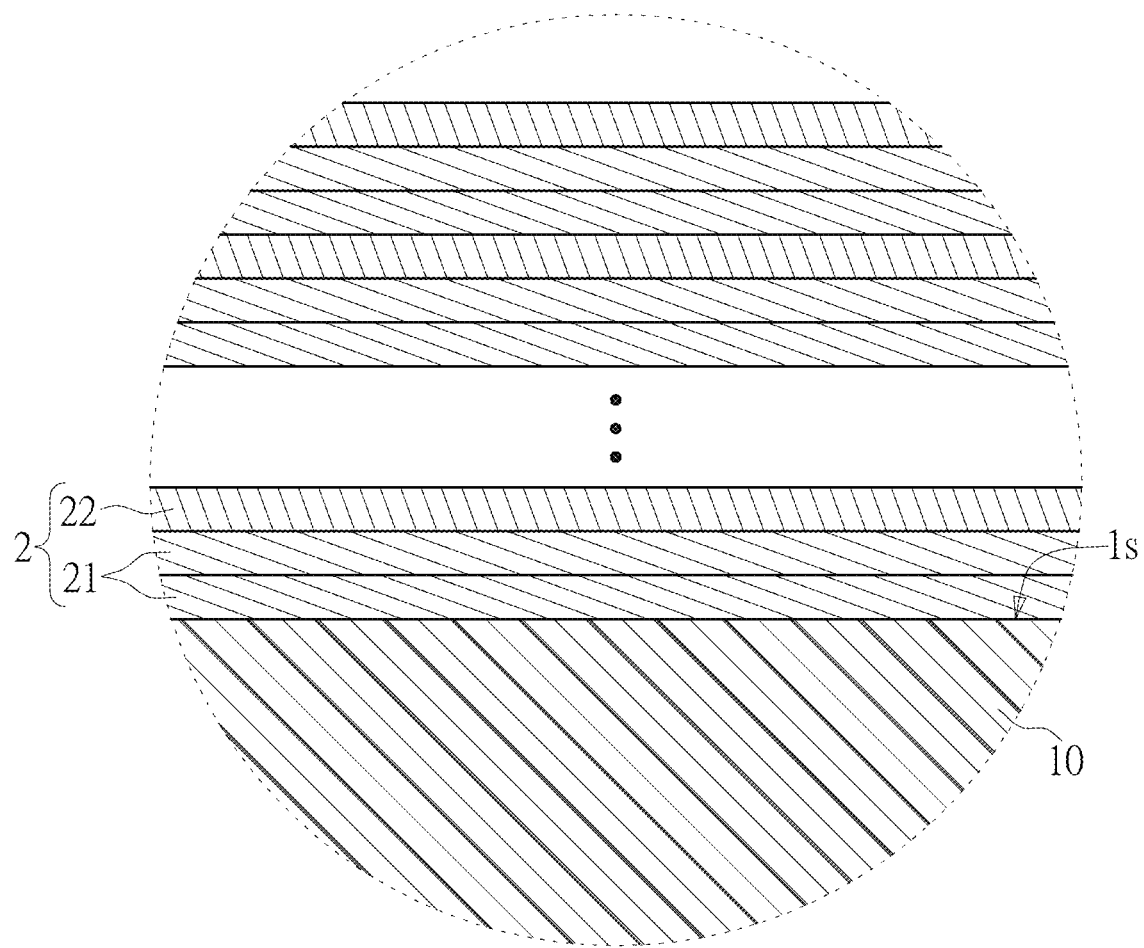
FIG. 5 is a partially enlarged sectional view of a contrast enhancement layer according to one embodiment of the present disclosure.

Reference is made to FIG. 5, which is a schematic partial enlarged sectional view of a contrast enhancement layer according to another embodiment of the present disclosure. The elements in the instant embodiment that are the same or similar to those of the embodiment shown in FIG. 4 are denoted by the same reference numerals, and will not be reiterated herein. In the contrast enhancement layer 2 of the instant embodiment, the layer number of the first material layers 21 is larger than the layer number of the second material layers 22. Specifically speaking, in the contrast enhancement layer 2 of the instant embodiment, one of the second material layers 22 is formed after two of the first material layers 21 are formed in each round of a deposition process of the contrast enhancement layer 2, but the present disclosure is not limited thereto. In another embodiment, two of the second material layers 22 can be formed after three of the first material layers 21 are formed in each round of a deposition process of the contrast enhancement layer 2.

When the first element contained in the first material layer 21 has a smaller atomic number than that of the second element contained in the second material layer 22, in comparison with the embodiment shown in FIG. 4, most of the pixels in the image of the contrast enhancement layer 2 shown in FIG. 5 have relatively higher grayscale values, and the image of the contrast enhancement layer 2 has a lighter color (or a higher average grayscale value).

Figure 6:
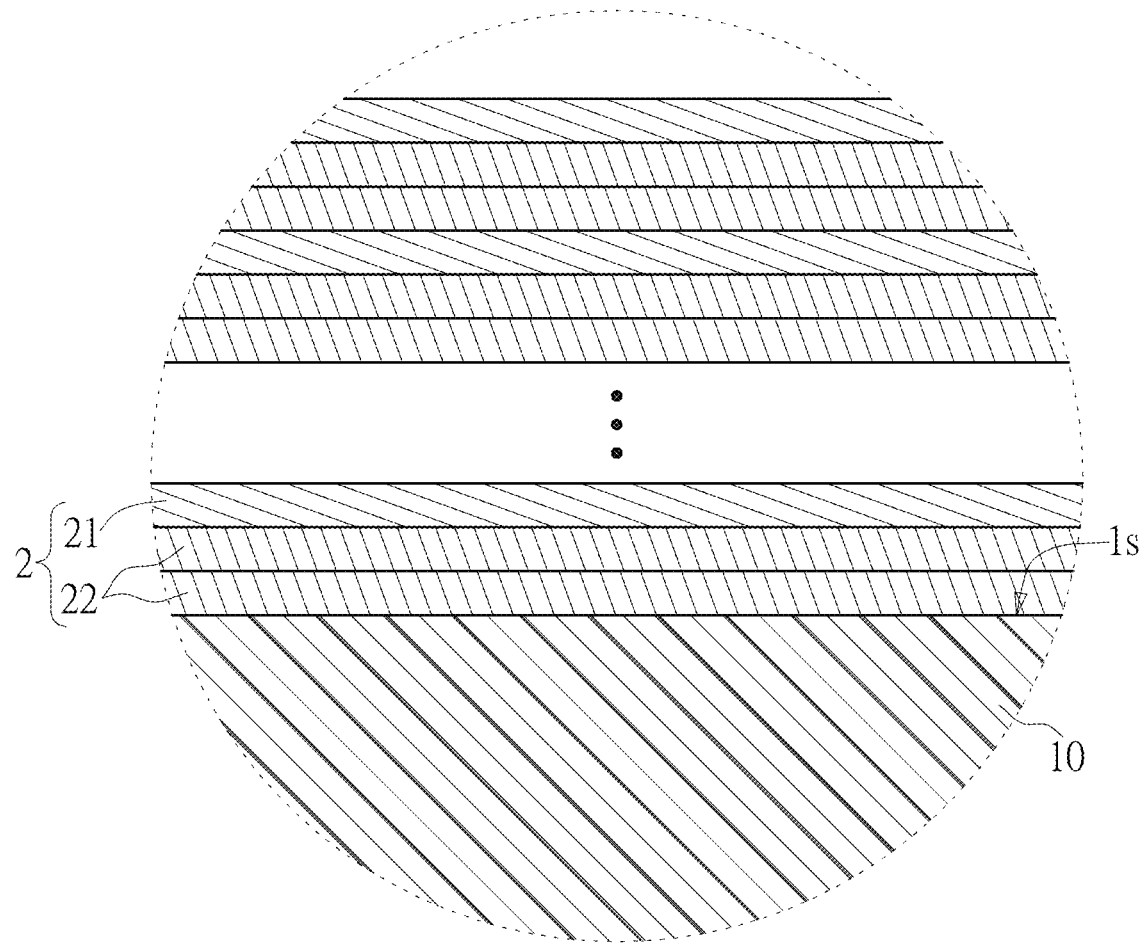
FIG. 6 is a partially enlarged sectional view of the contrast enhancement layer according to one embodiment of the present disclosure.

Reference is made to FIG. 6, which is a schematic partial enlarged sectional view of a contrast enhancement layer according to another embodiment of the present disclosure. The elements in the instant embodiment that are the same or similar to those of the embodiment shown in FIG. 4 are denoted by the same reference numerals, and will not be reiterated herein. In the contrast enhancement layer 2 of the instant embodiment, the layer number of the first material layers 21 is less than the layer number of the second material layers 22. Specifically speaking, in the contrast enhancement layer 2 of the instant embodiment, in each round, one of the first material layers 21 is formed after two of the second material layers 22 are formed, and one of the second material layers 22 is connected to the surface $1s$ of the sample to be inspected 1, but the present disclosure is not limited thereto.

When the first element contained in the first material layer 21 has a smaller atomic number than that of the second element contained in the second material layer 22, in comparison with the embodiment shown in FIG. 4, most of the pixels in the image of the contrast enhancement layer 2 shown in FIG. 6 have relatively lower grayscale values, and the image of the contrast enhancement layer 2 has a darker color (or a lower average grayscale value).

Accordingly, after the materials of the first and second material layers 21, 22 are selected, the average grayscale value of the contrast enhancement layer 2 can be changed by adjusting the layer numbers of the first and second material layers 21, 22, so as to be suitable for any kind of the sample to be inspected 1.

It is worth mentioning that the physical analysis method of the embodiment in the present disclosure can further include a step of establishing a grayscale value database. The grayscale value database includes at least a corresponding relationship between a material and the average grayscale value of the sample to be inspected 1, and a corresponding relationship between a material and the average grayscale value of the contrast enhancement layer 2. For example, the grayscale value database can include tables, graphs, or any combination thereof, so as to illustrate the two abovementioned corresponding relationships, but the present disclosure is not limited thereto.

To be more specific, when the contrast enhancement layer 2 is a composite film and includes at least the first and second material layers 21, 22, the corresponding relationship between the material and the average grayscale value of the contrast enhancement layer 2 can refer to a corresponding relationship between the average grayscale value of the contrast enhancement layer 2 and the layer number of the first or second material layers 21, 22, or a corresponding relationship between the average grayscale value of the image of the contrast enhancement layer 2 and a concentration of the first or second element.

In the following descriptions, the first material layer 21 is exemplified as an aluminum oxide layer and the second material layer 22 is exemplified as a hafnium oxide layer for illustration of the corresponding relationship between the average grayscale value of the image of the contrast enhancement layer 2 and the concentration of the first or second element, but the present disclosure is not limited thereto. The image of the contrast enhancement layer 2 can be captured by an electron microscope, such as a transmission electron microscope (TEM), a scanning electron microscope (SEM), or a focused ion beam (FIB) microscope. In the present disclosure, the transmission electron microscope (TEM) is exemplified to describe one example of the grayscale value database.

Figure 7:
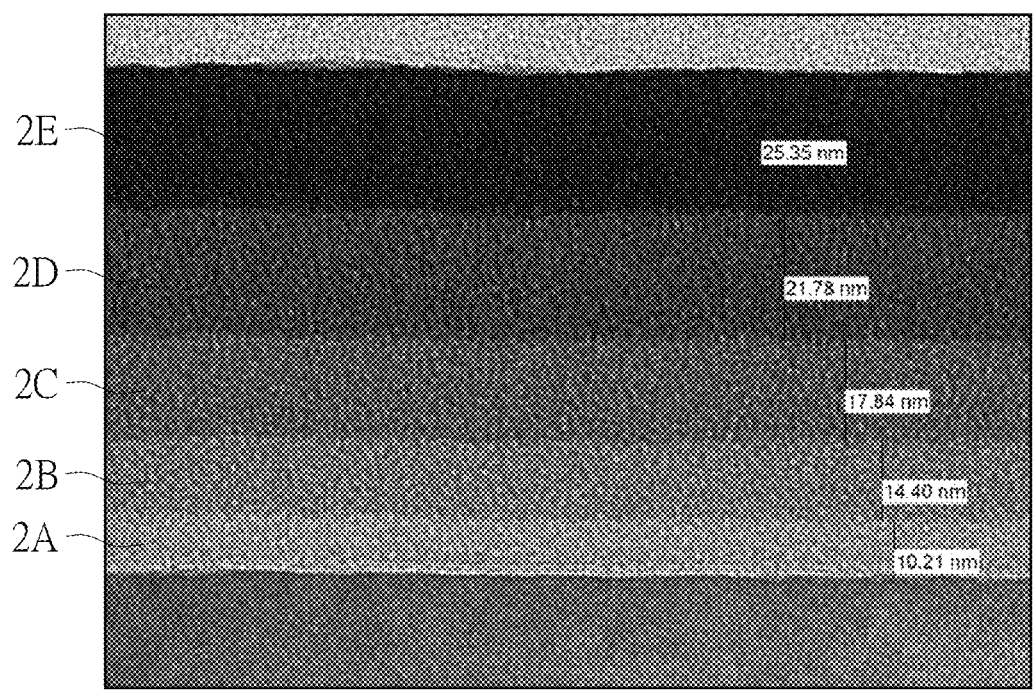
FIG. 7 shows transmission electron microscope (TEM) images of the contrast enhancement layers according to different embodiments of the present disclosure.

Reference is made to FIG. 7, which shows transmission electron microscope (TEM) images of the contrast enhancement layers according to different embodiments of the present disclosure. Furthermore, referring to the following table 1, a ratio of a layer number of the aluminum oxide layers to a layer number of the hafnium oxide layers in each of contrast enhancement layers 2A-2E and a range of the average grayscale value of the image of each of the contrast enhancement layers 2A-2E shown in FIG. 7 are listed, respectively. The layer number of the aluminum oxide layers is in positive correlation to the concentration of aluminum (Al), and the layer number of the hafnium oxide layers is in positive correlation to the concentration of hafnium (Hf).

TABLE 1

| contrast enhancement layer | Al:Hf | average grayscale value |
|---|---|---|
| 2A | 1:0 | 125-150 |
| 2B | 3:1 | 100-125 |
| 2C | 1:1 | 75-100 |
| 2D | 1:3 | 50-75 |
| 2E | 0:1 | 0-25 |

Referring to the table 1, which is to be read in conjunction with FIG. 7, it can be observed that the layer number of the hafnium oxide layers in the contrast enhancement layer 2A is 0, and the image of the contrast enhancement layer 2A has a highest average grayscale value and is of a lighter color. As the ratio of the layer number of the hafnium oxide layers to the layer number of the aluminum oxide layers is increased, the average grayscale value is gradually decreased. Accordingly, most pixels in the image of the contrast enhancement layer 2E have lower grayscale values. Therefore, the image of the contrast enhancement layer 2E has a lowest average grayscale value and is of a darker color.

Similarly, when the first material layer 21 and the second material layer 22 are each made of another material, and the images of different contrast enhancement layers 2 that respectively have different compositions are captured by the electron microscope, the average grayscale values respectively corresponding to the different contrast enhancement layers 2 can be obtained, thereby establishing the grayscale value database. Accordingly, before the step (S12) of forming the contrast enhancement layer 2, the ratio of the layer number of the first material layers to the layer number of the second material layers can be determined according to the grayscale value database, so that the difference between the average greyscale value of the image of the contrast enhancement layer 2 and the average grayscale value of the surface layer image of the sample to be inspected 1 is at least 50. That is to say, the contrast enhancement layer 2 can include m layers of first material layers 21 and n layers of second material layers 22, m and n each being zero or a positive integer, and satisfying the following relationship: (m+n)>0.

In one embodiment, the contrast enhancement layer 2 can be formed by an atomic layer deposition (ALD) process. That is to say, the contrast enhancement layer 2 is an ALD film layer. As mentioned previously, each of the microstructures 11 of the sample to be inspected 1 may have a nano-scale or a micro-scale dimension. Compared to other chemical vapor deposition processes or physical vapor deposition processes, the contrast enhancement layer 2 that is formed by the ALD process has a higher step coverage and better thickness uniformity. As such, a situation in which a surface contour of the sample to be inspected 1 cannot be clearly recognized due to a poor step coverage can be prevented during the physical analysis.

In one preferable embodiment, the step S1 of preparing the sample for physical analysis can further include: performing a heat treatment or a surface modification process on the sample to be inspected 1 before the step of forming the contrast enhancement layer 2. For example, in the aforementioned surface modification process, the sample to be inspected 1 is exposed to plasma or ultraviolet light, so as to form free radicals on the surface 1s of the sample to be inspected 1. The free radicals (such as oxygen radicals, nitrogen radicals, or hydroxyl radicals) aid activation of chemical reactions, so that a fabrication temperature of the atomic layer deposition process can be reduced. In one embodiment, the fabrication temperature of the atomic layer deposition process during the formation of the contrast enhancement layer 2 ranges from 40° C. to 200° C. Furthermore, forming the contrast enhancement layer 2 after the surface modification process is performed can also improve an adhesive force of the contrast enhancement layer 2.

In the instant embodiment, the atomic layer deposition process includes the following steps. The sample to be inspected 1 is placed in a film deposition chamber. A precursor containing a first element, a purge gas, and a first reactant gas are sequentially introduced into and evacuated from the film deposition chamber so as to form one of the first material layers 21. A precursor containing a second element, the purge gas, and a second reactant gas are sequentially introduced into and evacuated from the film deposition chamber so as to form one of the second material layers 22.

More specifically, forming the contrast enhancement layer 2 shown in FIG. 4 is taken as an example. After the sample to be inspected 1 is placed in the film deposition chamber and a vacuum is introduced therein, the gases are introduced in the following sequence: (1) the precursor containing the first element; (2) the purge gas; (3) the first reactant gas; (4) the purge gas; (5) the precursor containing the second element; (6) the purge gas; (7) the second reactant gas; and (8) the purge gas, so as to form at least one of the first material layers 21 and at least one of the second material layers 22. Afterwards, the gases (1) to (8) are repeatedly introduced into the film deposition chamber in the above-mentioned sequence, so as to alternately form the first material layers 21 and the second material layers 22, until the thickness of the contrast enhancement layer 2 reaches a predetermined value.

It should be noted that, when sequentially introducing the precursor containing the first element, the purge gas, the first reactant gas, the precursor containing the second element, or the second reactant gas, a gas outlet is also used to evacuate the remaining gases out of the film deposition chamber. In the embodiment of the present disclosure, by enlarging an inner diameter of the gas outlet, an exhaust velocity can be increased. To be more specific, the gas outlet with a larger inner diameter allows the exhaust velocity to be at least 8 times higher than each of supply velocities of the first and second reactant gases.

Furthermore, when the first material layer 21 is exemplified as an aluminum oxide layer and the second material layer 22 is exemplified as a hafnium oxide layer, the first and second reactant gases have the same composition. In one embodiment, the first reactant gas and the second reactant gas can be introduced into the film deposition chamber through the same reactant gas supplying pipe. In the embodiment of the present disclosure, an inner diameter of the reactant gas supplying pipe can be enlarged so as to increase supply amounts of the first and second reactant gases per unit time. In one preferable embodiment, a ratio of a supply velocity of the precursor containing the first element to the supply velocity of the first reactant gas ranges from 0.7 to 1.5, or a ratio of a supply velocity of the precursor containing the second element to the supply velocity of the second reactant gas ranges from 0.7 to 1.5. As such, not only can a deposition rate be improved, but contamination of the film deposition chamber can also be reduced during a film deposition process.

Furthermore, in the embodiment of the present disclosure, the step (S1) of preparing the sample for physical analysis further includes: forming a protective layer on the contrast enhancement layer.

Figure 8:
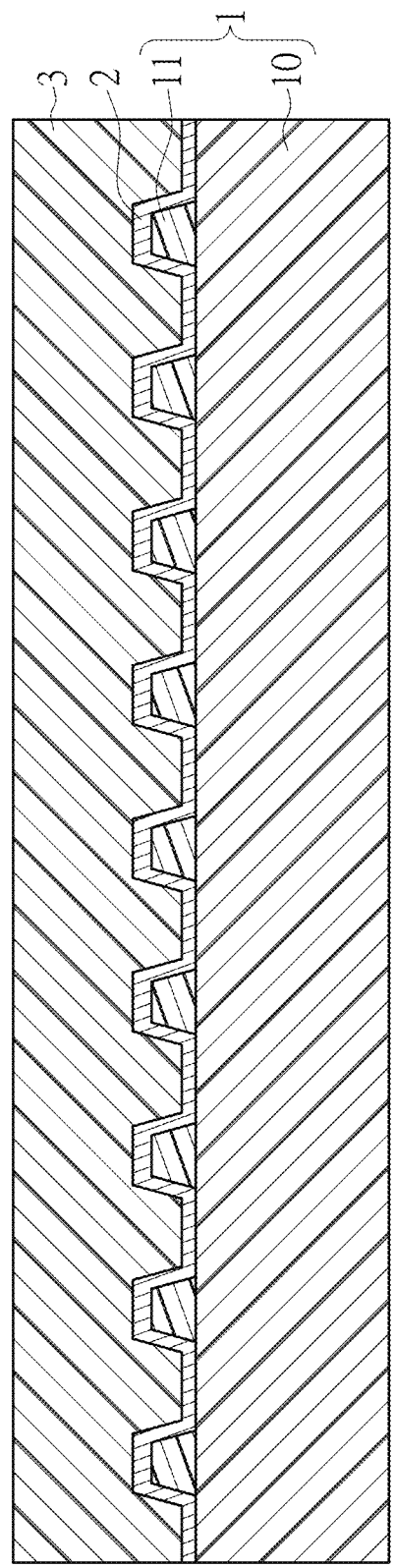
FIG. 8 is a partial sectional view of the sample for physical analysis according to one embodiment of the present disclosure.

Reference is made to FIG. 8, which is a schematic partial sectional view of a sample for physical analysis according to another embodiment of the present disclosure. Compared to the sample for physical analysis M1 of the previous embodiment, a sample for physical analysis M2 of the instant embodiment further includes a protective layer 3, and the protective layer 3 is disposed on the contrast enhancement layer 2 so as to further protect the sample to be inspected 1. The protective layer 3 can be a conductive layer or an insulating layer. To be more specific, the material of the protective layer 3 is for example, but not limited to, aluminum, aluminum oxide, and epoxy. In one embodiment, the protective layer 3 is a conductive layer so as to prevent the sample for physical analysis M2 from being damaged due to accumulation of static charges.

The protective layer 3 has a thickness greater than that of the contrast enhancement layer 2. In one embodiment, the thickness of the protective layer 3 ranges from 100 nm to 3 μm. Furthermore, the protective layer 3 can be formed on the contrast enhancement layer 2 by a physical vapor deposition process, a chemical vapor deposition process, a coating process, and any conventional deposition process, and the present disclosure is not limited thereto.

Figure 9:
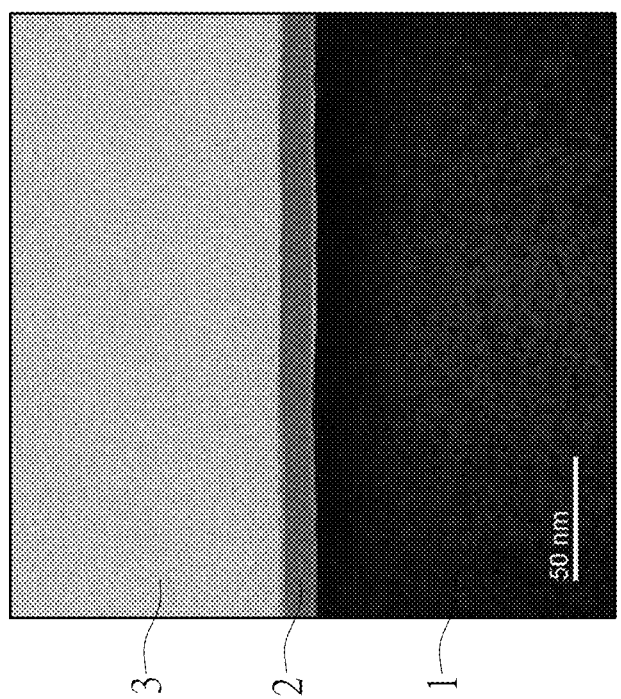
FIG. 9 shows a transmission electron microscope (TEM) image of the sample for physical analysis according to one embodiment of the present disclosure.

Reference is made to FIG. 9, which shows a transmission electron microscope (TEM) image of the sample for physical analysis according to another embodiment of the present disclosure. As mentioned above, the material of the contrast enhancement layer 2 can include only one element of an oxide, a nitride, or an oxynitride, or include two or more elements of an oxide, a nitride, or an oxynitride. As long as the difference between the average grayscale value of the image of the contrast enhancement layer 2 and the average grayscale value of the surface layer image of the sample to be inspected 1 is at least 50, the desired effect in the present disclosure can be achieved. In the instant embodiment, the material of the sample to be inspected 1 is silicon, and the material of the contrast enhancement layer 2 is titanium oxide ($TiO_x$). It can be observed from the TEM image shown in FIG. 9 that most of the pixels in the surface layer image of the sample to be inspected 1 have lower grayscale values and are of a darker color, and most of the pixels in the image of the contrast enhancement layer 2 have higher grayscale values and are of a lighter color, so that the edge contrast and the edge acutance of the sample to be inspected 1 in the TEM image can be enhanced.

Figure 10:
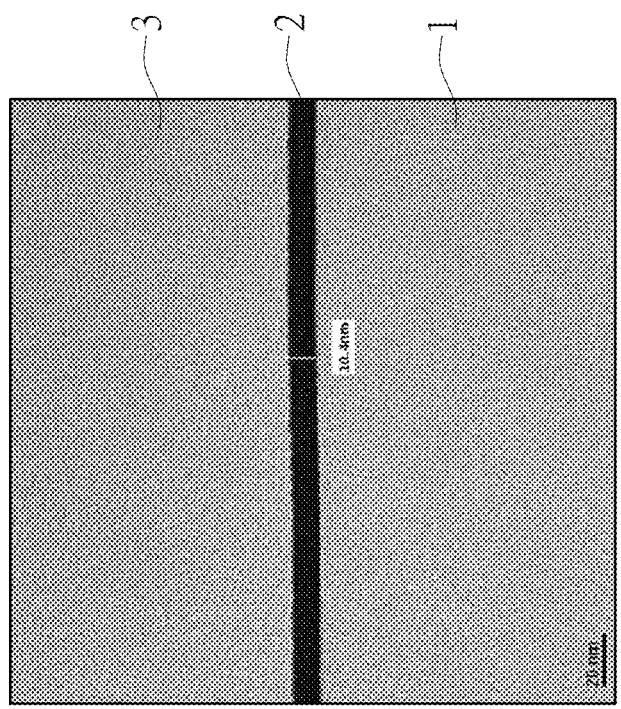
FIG. 10 shows a transmission electron microscope (TEM) image of the sample for physical analysis according to one embodiment of the present disclosure.

Reference is made to FIG. 10, which shows a transmission electron microscope (TEM) image of the sample for physical analysis according to yet another embodiment of the present disclosure. In the instant embodiment, the material of the sample to be inspected 1 is silicon oxide, and the material of the contrast enhancement layer 2 is hafnium oxide ($HfO_x$). It can be observed from the TEM image shown in FIG. 10 that most of the pixels in the surface layer image of the sample to be inspected 1 have higher grayscale values and are of a lighter color, and most of the pixels in the image of the contrast enhancement layer 2 have lower grayscale values and are of a darker color, so that the edge contrast and the edge acutance of the sample to be inspected 1 in the TEM image can be enhanced.

Beneficial Effects of the Embodiments

In conclusion, one of the advantages of the present disclosure is that in the physical analysis method, the sample for physical analysis, and the preparing method thereof, by virtue of "forming the contrast enhancement layer 2 on the surface of the sample to be inspected 1" and "in the image captured by the electron microscope, a difference between the average grayscale value of the surface layer image of the sample to be inspected 1 and the average grayscale value of the image of the contrast enhancement layer 2 being at least 50," the sample to be inspected 1 can be protected, and the edge contrast and the edge acutance thereof can be improved, thereby reducing inspection time and cost.

To be more specific, the contrast enhancement layer 2 can be a composite film that includes at least two different kinds of material layers, such as the plurality of first material layers 21 and the plurality of material layers 22 that are stacked upon one another, and each one of the first material layers 21 and the second material layers 22 has a thickness that does not exceed 0.1 nm. By alternately forming the first and second material layer 21, 22 and changing the ratio of the layer number of the first material layers 21 to the layer number of the second material layers 22, the grayscale shades of the image of the contrast enhancement layer 2 can be adjusted so as to suitable for different samples to be inspected 1 that are made of different materials.

That is to say, by adjusting the ratio of the layer number of the first material layers 21 to the layer number of the second material layers 22, the average grayscale value of the image of the contrast enhancement layer 2 can be adjusted within a specific range, so as to be adapted to enhance the edge contrast and the edge acutance of the images of different samples to be inspected 1 that have different average grayscale values. As such, there is no need to develop various fabrication processes of different contrast enhancement layers 2 that respectively include different materials for cooperation with the average grayscale of the images of the samples to be inspected 1.

Furthermore, in the physical analysis method according to one embodiment of the present disclosure, by establishing the grayscale value database, the layer numbers and stacking manners of the first and second material layers 21, 22 can be determined, so that the difference between the average grayscale value of the image of the contrast enhancement layer 2 and the average grayscale value of the surface layer image of the sample to be inspected 1 is at least 50. As such, according to the material of the sample to be inspected 1, the fabrication processes of by which the contrast enhancement layer 2 is to be fabricated can be quickly determined, and a development time for the fabrication process of the contrast enhancement layer 2 can be shortened.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A preparing method of a sample for physical analysis, comprising:
   providing a sample to be inspected; and
   forming a contrast enhancement layer on a surface of the sample to be inspected according to a material of the sample to be inspected, wherein the contrast enhancement layer includes m layers of first material layers and n layers of second material layers that are stacked upon one another, m and n each being zero or a positive integer, and satisfying the following relationship: (m+n)>0;
   wherein a material of each of the first material layers is different from a material of each of the second material layers, and each one of the first material layers and the second material layers has a thickness that does not exceed 0.1 nm; and
   wherein in an image captured by an electron microscope, a difference between an average grayscale value of a surface layer image of the sample to be inspected and an average grayscale value of an image of the contrast enhancement layer is at least 50.

2. The preparing method according to claim 1, further comprising: performing a heat treatment or a surface modification process on the sample to be inspected before the step of forming the contrast enhancement layer.

3. The preparing method according to claim 2, wherein the surface modification process is performed by exposing the sample to be inspected to plasma or ultraviolet light.

4. The preparing method according to claim 1, further comprising: forming a protective layer on the contrast enhancement layer, wherein the protective layer is a conductive layer or an insulating layer.

5. The preparing method according to claim 1, wherein the contrast enhancement layer has a total thickness ranging from 2 nm to 30 nm.

6. The preparing method according to claim 1, wherein the contrast enhancement layer is formed by performing an atomic layer deposition process, and a fabrication temperature of the atomic layer deposition process ranges from 40° C. to 200° C.

7. The preparing method according to claim 1, wherein the material of each of the first material layers is an oxide, a carbide, a nitride, or an oxynitride of a first element, and the material of each of the second material layers is an oxide, a carbide, a nitride, or an oxynitride of a second element, and a difference between an atomic number of the first element and an atomic number of the second element is greater than or equal to 20.

8. The preparing method according to claim 7, wherein the first element and the second element are each selected from a group consisting of a metal element, a non-metallic element, and a combination thereof.

9. The preparing method according to claim 8, wherein the metal element is aluminum, hafnium, titanium, platinum, indium, tin, zirconium, gallium, molybdenum or tantalum, and the non-metallic element is silicon, boron, selenium, tellurium, or arsenic.

10. The preparing method according to claim 1, wherein the contrast enhancement layer is formed by an atomic layer deposition process, and the atomic layer deposition process includes:
    placing the sample to be inspected in a film deposition chamber;
    sequentially introducing a precursor containing a first element, a purge gas, and a first reactant gas into the film deposition chamber so as to form one of the first material layers, and sequentially evacuating the precursor containing the first element, the purge gas, and the first reactant gas from the film deposition chamber;
    sequentially introducing a precursor containing a second element, the purge gas, and a second reactant gas into the film deposition chamber so as to form one of the second material layers, and sequentially evacuating the precursor containing the second element, the purge gas, and the second reactant gas from the film deposition chamber;
    wherein the precursor containing the first element, the purge gas, the first reactant gas, the precursor containing the second element, the second reactant gas are evacuated from the film deposition chamber through a gas outlet at an exhaust velocity, and the exhaust velocity is at least 8 times higher than a supply velocity of the first reactant gas and a supply velocity of the second reactant gas.

11. The preparing method according to claim 10, wherein a composition of the first reactant gas is the same as a composition of the second reactant gas, and the first and second reactant gases are both introduced into the film deposition chamber through a reactant gas supplying pipe; wherein a ratio of a supply velocity of the precursor containing the first element to the supply velocity of the first reactant gas ranges from 0.7 to 1.5, or a ratio of a supply velocity of the precursor containing the second element to the supply velocity of the second reactant gas ranges from 0.7 to 1.5.

12. A sample for physical analysis, comprising: a sample to be inspected and a contrast enhancement layer, wherein the contrast enhancement layer is formed on a surface of the sample to be inspected, and includes m layers of first material layers and n layers of second material layers that are stacked upon one another, m and n each being zero or a positive integer, and satisfying the following relationship: (m+n)>0; and
    wherein a material of each of the first material layers is different from a material of each of the second material layers, and each one of the first and second material layers has a thickness that does not exceed 0.1 nm;
    wherein in an image captured by an electron microscope, a difference between an average grayscale value of a surface layer image of the sample to be inspected and an average grayscale value of an image of the contrast enhancement layer is at least 50.

13. The sample for physical analysis according to claim 12, further comprising: a protective layer disposed on the contrast enhancement layer, wherein the protective layer is a conductive layer or an insulating layer.

14. The sample for physical analysis according to claim 12, wherein the contrast enhancement layer has a total thickness ranging from 2 nm to 30 nm.

15. The sample for physical analysis according to claim 12, wherein the contrast enhancement layer is an atomic layer deposition (ALD) layer.

16. The sample for physical analysis according to claim 12, wherein the material of each of the first material layers is an oxide, a carbide, a nitride, or an oxynitride of a first element, and the material of each of the second material layers is an oxide, a carbide, a nitride, or an oxynitride of a second element, and a difference between an atomic number of the first element and an atomic number of the second element is greater than or equal to 20.

17. The sample for physical analysis according to claim 16, wherein the first element and the second element are each selected from a group consisting of a metal element, a non-metallic element, and a combination thereof.

18. The sample for physical analysis according to claim 17, wherein the metal element is aluminum, hafnium, titanium, platinum, indium, tin, zirconium, gallium, molybdenum or tantalum, and the non-metallic element is silicon, boron, selenium, tellurium, or arsenic.

19. A physical analysis method comprising:
preparing a sample for physical analysis, including:
providing a sample to be inspected; and
forming a contrast enhancement layer on a surface of the sample to be inspected according to a material of the sample to be inspected;
and
capturing an image of the sample for physical analysis, wherein the image of the sample for physical analysis contains an image of the contrast enhancement layer and an image of the sample to be inspected;
wherein a difference between an average grayscale value of the image of the contrast enhancement layer and an average grayscale value of a surface layer image of the sample to be inspected is at least 50.

20. The physical analysis method according to claim 19, wherein the contrast enhancement layer is a composite film that includes m layers of first material layers and n layers of second material layers stacked upon one another, m and n each being zero or a positive integer, and satisfying the following relationship: (m+n)>0; and
wherein a material of each of the first material layers is different from a material of each of the second material layers, and each one of the first material layers and the second material layers has a thickness that does not exceed 0.1 nm.

21. The physical analysis method according to claim 20, wherein the material of each of the first material layers is an oxide, a carbide, a nitride, or an oxynitride of a first element, and the material of each of the second material layers is an oxide, a carbide, a nitride, or an oxynitride of a second element, and a difference between an atomic number of the first element and an atomic number of the second element is greater than or equal to 20.

22. The physical analysis method according to claim 19, further comprising:
establishing a grayscale value database, wherein the grayscale value database includes at least a corresponding relationship between the material of the sample to be inspected and the average grayscale value of the surface layer image of the sample to be inspected, and a corresponding relationship between a material of the contrast enhancement layer and the average grayscale value of the image of the contrast enhancement layer.

23. The physical analysis method according to claim 22, wherein the contrast enhancement layer is a composite film that includes a plurality of first material layers and a plurality of second material layers stacked upon one another, and the corresponding relationship between the material of the contrast enhancement layer and the average grayscale value of the image of the contrast enhancement layer is a corresponding relationship between the average grayscale value of the image of the contrast enhancement layer and a layer number of the first material layers or the second material layers, and the physical analysis method further comprises:
determining, before the step of forming the contrast enhancement layer, a ratio of the layer number of the first material layers to the layer number of the second material layers according to the grayscale value database, so that the difference between the average grayscale value of the image of the contrast enhancement layer and the average grayscale value of the surface layer image of the sample to be inspected is at least 50.

24. The physical analysis method according to claim 19, wherein the image of the sample for physical analysis is captured by using a transmission electron microscope (TEM).

25. The physical analysis method according to claim 19, wherein the step of preparing the sample for physical analysis further includes: forming a protective layer on the contrast enhancement layer, wherein the protective layer is a conductive layer or an insulating layer.

26. The physical analysis method according to claim 19, wherein the step of preparing the sample for physical analysis further includes: performing a heat treatment or a surface modification process on the sample to be inspected before the step of forming the contrast enhancement layer.

27. The physical analysis method according to claim 19, wherein the contrast enhancement layer is formed by an atomic layer deposition process, and the atomic layer deposition process includes:
placing the sample to be inspected in a film deposition chamber;
sequentially introducing a precursor containing a first element, a purge gas, and a first reactant gas into the film deposition chamber so as to form one of a plurality of first material layers, and sequentially evacuating the precursor containing the first element, the purge gas, and the first reactant gas from the film deposition chamber;
sequentially introducing a precursor containing a second element, the purge gas, and a second reactant gas into the film deposition chamber so as to form one of a plurality of second material layers, and sequentially evacuating the precursor containing the second element, the purge gas, and the second reactant gas from the film deposition chamber;
wherein the precursor containing the first element, the purge gas, the first reactant gas, the precursor containing the second element, the second reactant gas are evacuated from the film deposition chamber through a gas outlet at an exhaust velocity, and the exhaust velocity is at least 8 times higher than a supply velocity of the first reactant gas and a supply velocity of the second reactant gas.

28. The physical analysis method according to claim 27, wherein a composition of the first reactant gas is the same as a composition of the second reactant gas, and the first and second reactant gases are both introduced into the film deposition chamber through a reactant gas supplying pipe; wherein a ratio of a supply velocity of the precursor containing the first element to the supply velocity of the first reactant gas ranges from 0.7 to 1.5, or a ratio of a supply velocity of the precursor containing the second element to the supply velocity of the second reactant gas ranges from 0.7 to 1.5.

\* \* \* \* \*